United States Patent [19]
Lee et al.

[11] Patent Number: 6,049,484
[45] Date of Patent: *Apr. 11, 2000

[54] ERASE METHOD TO IMPROVE FLASH EEPROM ENDURANCE BY COMBINING HIGH VOLTAGE SOURCE ERASE AND NEGATIVE GATE ERASE

[75] Inventors: Jian-Hsing Lee, Hsin-Chu; Kuo-Reay Peng, Faung-San; Juang-Ke Yeh, Hsin-Chu; Ming-Chou Ho, Taichung, all of Taiwan

[73] Assignee: Taiwan Semiconductor Manufacturing Company, Hsin-Chu, Taiwan

[*] Notice: This patent is subject to a terminal disclaimer.

[21] Appl. No.: 09/150,907
[22] Filed: Sep. 10, 1998
[51] Int. Cl.[7] .................................................. G11C 16/04
[52] U.S. Cl. ............................. 365/185.29; 365/185.29; 365/185.19; 365/185.26; 365/185.27; 365/185.33
[58] Field of Search ....................... 365/185.29, 185.19, 365/185.26, 185.27, 185.33

[56] References Cited

U.S. PATENT DOCUMENTS

| | | | |
|---|---|---|---|
| 5,231,602 | 7/1993 | Radjy et al. | 365/185 |
| 5,243,559 | 9/1993 | Murai | 365/185 |
| 5,361,235 | 11/1994 | Kodama | 365/218 |
| 5,414,669 | 5/1995 | Tedrow et al. | 365/226 |
| 5,457,652 | 10/1995 | Brahmbhatt | 365/185.06 |
| 5,481,494 | 1/1996 | Tang et al. | 365/185.24 |
| 5,485,423 | 1/1996 | Tang et al. | 365/185 |
| 5,491,657 | 2/1996 | Haddad et al. | 365/185.27 |
| 5,521,866 | 5/1996 | Akaogi | 365/185.29 |
| 5,903,499 | 5/1999 | Peng et al. | 365/185.29 |

*Primary Examiner*—David Nelms
*Assistant Examiner*—Connie C. Yoha
*Attorney, Agent, or Firm*—George O. Saile; Stephen B. Ackerman; Billy Knowles

[57] ABSTRACT

A method to erase data from a flash EEPROM is disclosed. Electrical charges trapped in the tunneling oxide of a flash EEPROM are eliminated to maintain proper separation of the programmed threshold voltage and the erased threshold voltage after extended programming and erasing cycles. The method to erase a flash EEPROM cell begins by erasing the flash EEPROM cell by first applying a high positive voltage pulse to the source of the EEPROM cell. Simultaneously, a ground reference potential is applied to the semiconductor substrate and the control gate. At this same time the drain is floating. Floating the source and drain and applying the ground reference potential to the semiconductor substrate then detraps the flash EEPROM cell. At the same time, a relatively large negative voltage pulse is applied to the control gate.

20 Claims, 7 Drawing Sheets

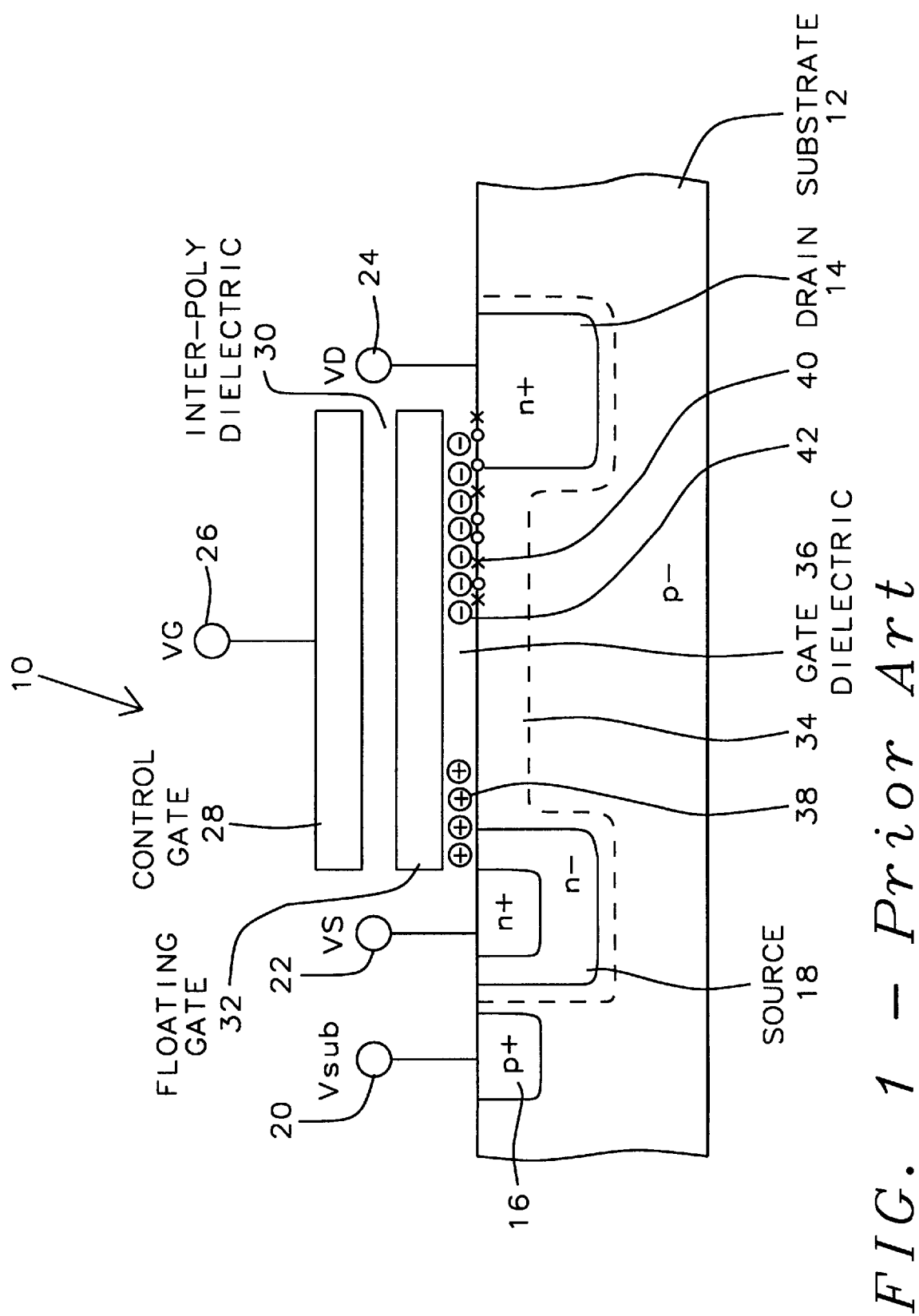
FIG. 1 – Prior Art

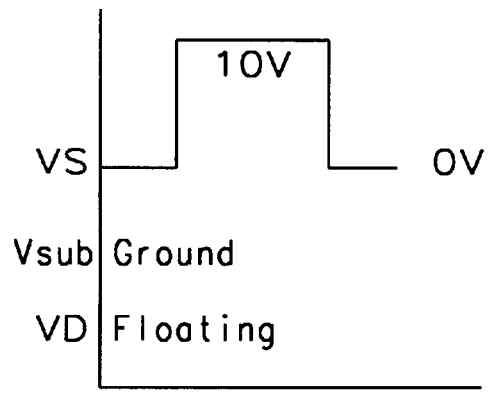
*FIG. 2 - Prior Art*
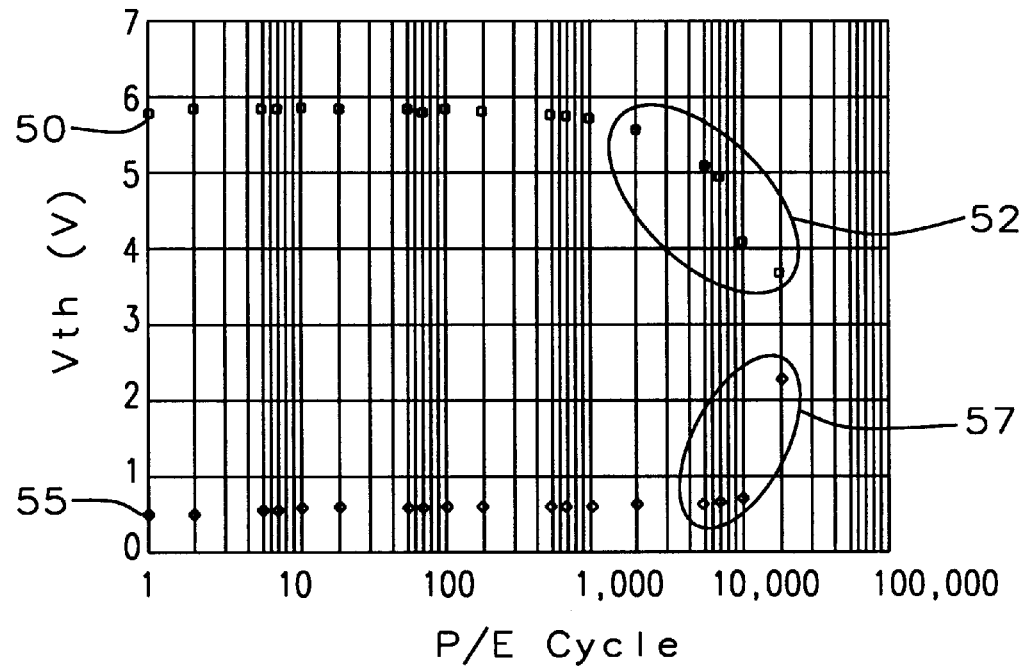
*FIG. 3a - Prior Art*

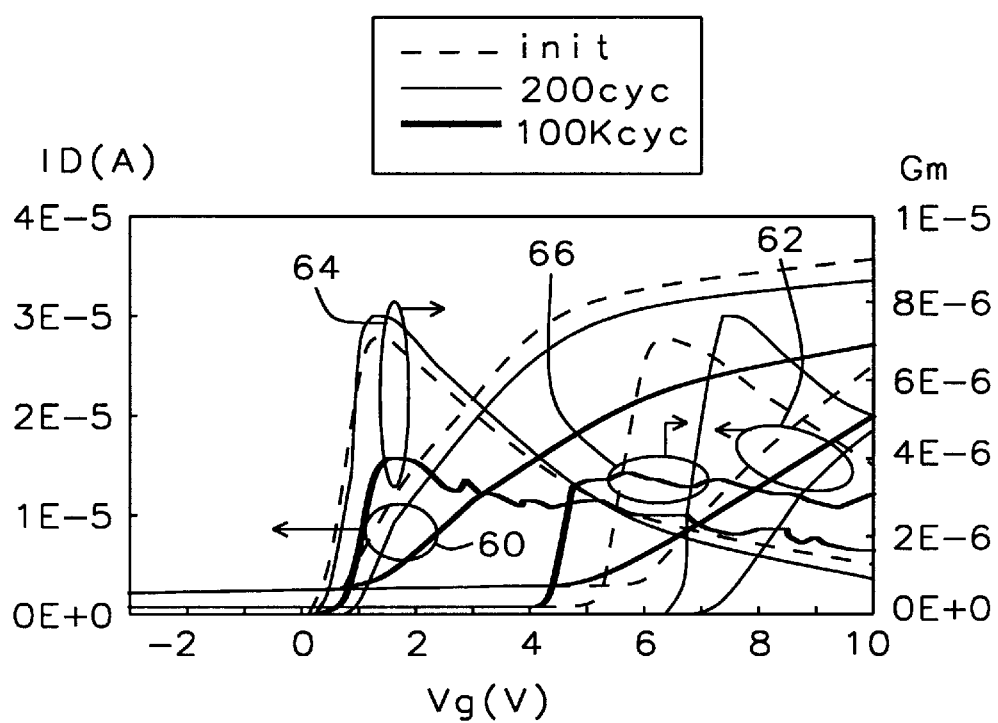
FIG. 3b – Prior Art

ERASE METHOD TO IMPROVE FLASH EEPROM ENDURANCE BY COMBINING HIGH VOLTAGE SOURCE ERASE AND NEGATIVE GATE ERASE

RELATED PATENT APPLICATIONS

U.S. Pat. No. 5,979,717, "A Novel Method To Improve Flash EEPROM Write/Erase Threshold Closure," Ser. No. 08/928,217, Filing Date: Sep. 12, 1997, assigned to the Same Assignee as the present invention.

U.S. Pat. No. 5,903,499, "A Novel Method to Erase A Flash EEPROM Using Negative Gate Source Erase Followed By a High Negative Gate Erase," Ser. No. 08/928,127, Filing Date: Sep. 12, 1997, assigned to the Same Assignee as the present invention.

U.S. Pat. No. 5,838,618, "A Bi-Modal Erase Method For Eliminating Cycling-induced Flash EEPROM Cell Write/Erase Threshold Closure," Ser. No. 08/927,472, Filing Date: Sep. 11, 1997, assigned to the Same Assignee as the present invention.

U.S. Pat. No. 5,862,078, "A Mixed Mode Erase Method To Improve Flash EEPROM Write/Erase Threshold Closure," Ser. No. 08/907,984, Filing Date: Aug. 11, 1997, assigned to the Same Assignee as the present invention.

U.S. patent to be issued entitled, "A Novel Erase Method Of Flash EEPROM By Using Snapback Characteristic," Ser. No. 08/957,678, Filing Date: Oct. 24, 1997, assigned to the Same Assignee as the present invention.

BACKGROUND OF THE INVENTION

1. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell.

2. Description of Related Art

The structure and application of the flash EEPROM is well known in the art. The Flash EEPROM provides the density advantages of an erasable programmable read-only memory (EPROM) that employs ultra-violet light to eliminate the programming with the speed of a standard EEPROM. FIG. 1 illustrates a cross-sectional view of a flash EEPROM cell of the prior art. The flash EEPROM cell 10 is formed within a p-type substrate 12. An $n^+$ drain region 14 and an $n^+$ source region 18 is formed within the p-type substrate 12.

A relatively thin gate dielectric 36 is deposited on the surface of the p-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 18. An interpoly dielectric layer 30 is placed on the floating gate 32 to separate the floating gate 32 from a second layer of poly-crystalline silicon that forms a control gate 28.

A $p^+$ diffusion 16 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub will be set to the ground reference potential (0V).

The source region 18 will be connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10.5V). The drain voltage generator VD is set to a moderately high voltage (on the order of 6V), while the source voltage generator VS is set to the ground reference potential (0V).

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process, some of the hot electrons will be trapped 42 in the tunneling oxide 36 or in surface states 40 at the surface of the p-type substrate 12. These trapped electrons will cause the threshold voltage of the erased flash EEPROM cell 10 to decrease.

To erase the flash EEPROM cell 10, as shown in FIG. 2, a positive voltage (on the order of 10V) is generated by the source voltage generator VS. The control gate voltage generator VG and the substrate voltage generator VS are set to the ground reference potential. The drain voltage generator VD is usually disconnected from the terminal 24 to allow the drain region 14 to float. Under these conditions there is a large electric field developed across the tunnel oxide 36 in the source 18 and floating gate 32 overlap region. This field causes the electrons trapped in the floating gate 32 to flow to portion of the floating gate 32 that overlaps the source region 18. The electrons are then extracted to the source region 18 by the Fowler-Nordheim tunneling.

During the erasure process, some positive charges 38 that result from band-to-band tunneling, will be forced and trapped in the tunnel oxide 36. These trapped positive charges will act as trapping centers which cause the erase threshold voltage to decrease when the holes are trapped the beginning of the cycling and make the threshold voltage increase when electrons are trapped instead of the hole. As can be shown in FIG. 3a, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time, the flash EEPROM will no longer be able to operate reliably to store digital data.

Referring back to FIG. 1 during the erasure process, some positive charges 38 will be forced and trapped in the tunneling oxide 36. These trapped positive charges 38 will cause the threshold voltage of the programmed flash EEPROM cell 10 to increase. As can be shown in FIG. 3a, Referring after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time, the flash EEPROM will no longer be able to operate reliably to store digital data.

Another illustration of the impact of the trapped charges is shown in FIG. 3b. FIG. 3b shows the drain current $I_d$ versus the voltage $V_g$ at the control gate for the cell of FIG. 1. The set of curves 60 are for a cell that has been erased, while the set of curves 62 are for a cell that has been programmed. As can be seen, after 100K cycles of writing and erasing, the drain current $I_d$ will decrease for a given control gate voltage $V_g$. Further FIG. 3b shows the change of transconductance $G_m$ versus the voltage $V_g$ at the control gate for the cell of FIG. 1b. The set of curves 64 is for a cell that has been erased and the set of curves 66 are for a cell that has been written. Again, as can been seen, having been exposed to 100 k cycles of writing and erasing will cause the transconductance $G_m$ to shift for a given control gate voltage $V_g$.

To erase the flash EEPROM cell 10 as described in U.S. Pat. No. 5,481,494 (Tang et al.), a moderately high positive voltage (on the order of 5V) is generated by the source voltage generator VS. Concurrently, the gate control voltage generator VG is set to a relatively large negative voltage (on the order of −10V). The substrate voltage generator VS are set to the ground reference potential. The drain voltage generator VD is usually disconnected from the terminal 24 to allow the drain region 14 to float. Under these conditions there is a large electric field developed across the tunneling oxide 36 in the source region 18. This field causes the electrons trapped in the floating gate 32 to flow to portion of the floating gate 32 that overlaps the source region 18. The electrons are then extracted to the source region 18 by the Fowler-Nordheim tunneling.

Further Tang et al. shows a method for tightening the threshold voltage $V_T$ distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

U.S. Pat. No. 5,485,423 (Tang et al.) describes a method of erasure of a flash EEPROM. A moderately large positive voltage pulse is generated by the source voltage generator VS. Simultaneously, a negative ramp voltage is developed by the gate control voltage generator VG. The drain voltage generator VG will be disconnected from the drain to allow the drain to float and the substrate voltage generator will be set to the ground reference potential as above described. This method will achieve an averaging of the tunneling field during the entire erase cycle.

U.S. Pat. No. 5,521,866 (Akaogi) describes a non volatile semiconductor memory device having a floating gate. The memory device is constructed with two wells diffused into the semiconductor substrate. The source and drain are then diffused into the second well with a floating gate and control gate disposed on the surface of the semiconductor substrate much as described in FIG. 1. The erasure process involves applying a positive voltage to each of the two wells.

U.S. Pat. No. 5,491,657 (Haddad et al.) describes an improved method for bulk (or byte) programming an array of flash EEPROM memory cells. A negative voltage is applied to the substrate of the array. A reference voltage of zero volts is applied simultaneously to the drain regions of selected memory cells that are to be programmed. There is also applied simultaneously the same reference voltage of zero volts to the control gates of the selected memory cells. Haddad et al. provides for low current consumption and fast programming of the memory cell. The memory array requires only a single, low voltage power supply. The endurance reliability is greater than 100,000 cycles.

U.S. Pat. No. 5,414,669 (Tedrow et al.) describes an integrated circuit arrangement for providing erase voltages to a flash EEPROM memory array. The integrated circuit arrangement of Tedrow et al. includes a charge pump for generating a first high voltage with substantial current which may be used for application to the source terminals of flash EEPROM memory cells during erase and to the gate terminals of flash EEPROM memory cells during programming. Another charge pump for generating a second lower voltage is provided. The second lower voltage maybe used for application to the drain terminals of flash EEPROM memory cells during programming.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further another object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a method to erase a flash EEPROM cell begins by erasing said flash EEPROM cell by applying a large positive voltage pulse of approximately 10V to the source of the flash EEPROM cell. Concurrently a ground reference potential is applied to the semiconductor substrate and the control gate. While concurrently the drain is made to be floating. The flash EEPROM cell is detrapped floating the source and drain, and concurrently applying the ground reference potential to the semiconductor substrate. At this time, a relatively large negative voltage pulse of approximately −12V is applied to the control gate.

BRIEF DESCRIPTION OF THE DRAWINGS

FIG. 1 is cross-sectional view of a flash EEPROM of the prior art.

FIG. 2 is a timing diagram of an erase cycle of the flash EEPROM of the prior art.

FIG. 3a is a plot of the threshold voltages versus the number of programming and erasing cycles, using the erasing cycle of the prior art. as shown in FIG. 2.

FIG. 3b is a plot of the drain current ID and the transconductance Gm versus the gate voltage VG of a flash EEPROM of the prior art.

DETAILED DESCRIPTION OF THE INVENTION

Figure 4:
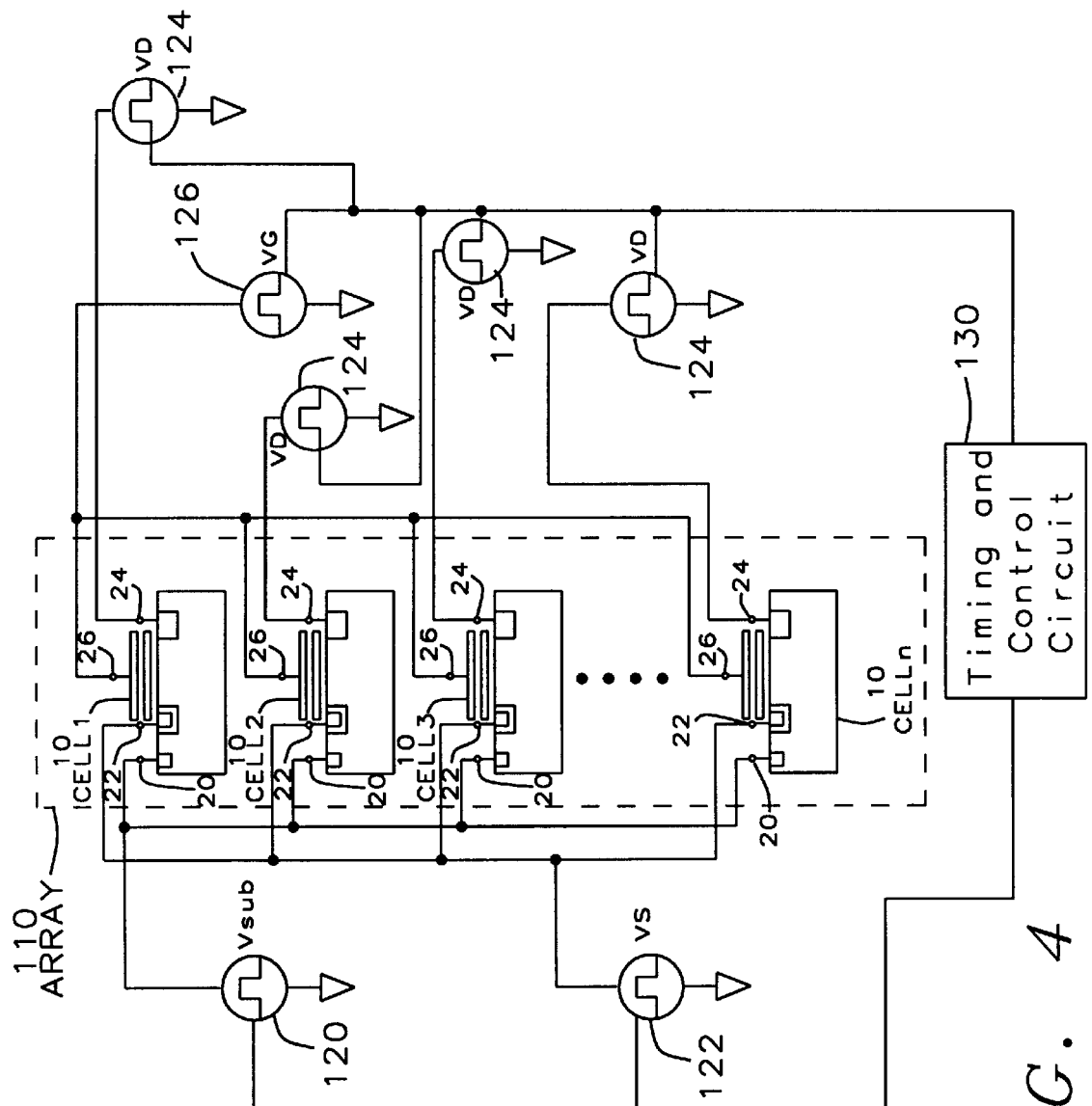
FIG. 4 is an array of flash EEPROM cells showing the connections of the voltage generators of this invention.

Referring now to FIG. 4, an array 110 of flash EEPROM cells 10 are disposed upon a common substrate. For convenience of design, the cells Cell1, Cell2, Cell3, . . . , Celln will be formed into rows and column. The array will have auxiliary circuitry (not shown) that will address the individual cells Cell1, Cell2, Cell3, . . . , Celln for reading from the cells or for writing or programming the cells. The writing or programming procedures will as described for the flash EEPROM cell of FIG. 1.

The connection for the substrate voltage generator Vsub 120 will be connected through the terminal 20 to the p-type substrate. The connection of the source voltage generator VS 122 to the source region is through the terminal 22. The connection of the drain voltage generator VD 124 to the drain region is through terminal 24. And the connection of the gate control voltage generator VG 126 to the control gate is through the terminal 26. The timing and control circuitry 130 in conjunction with the auxiliary circuitry (not shown) will determine the voltages and timings for the substrate voltage generator Vsub 120, the source voltage generator VS 122, the drain voltage generator VD 124, and the gate control voltage generator VG 126.

Figure 5:
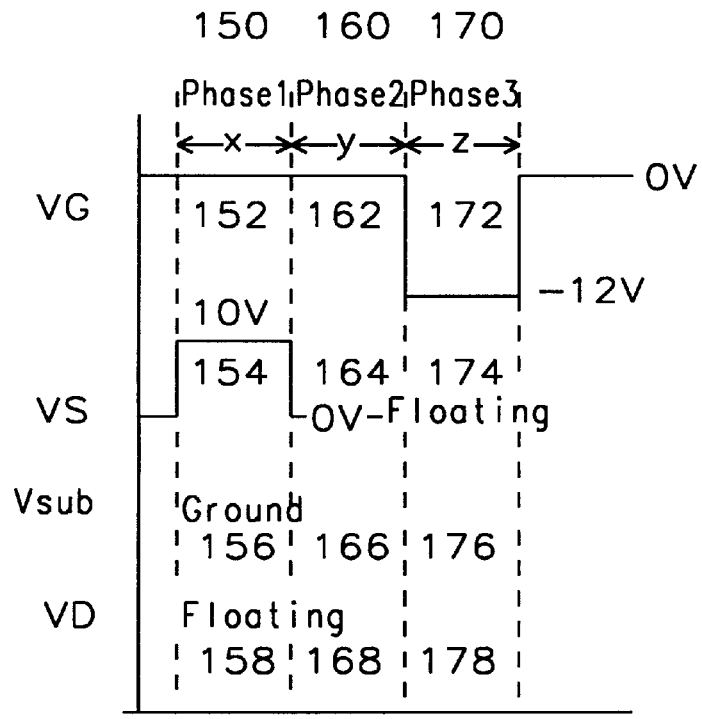
FIG. 5 is timing diagram of an erase cycle of a flash EEPROM of this invention.

Refer now to FIGS. 1, 4, and 5 to understand the erase cycle of this invention. The initial period of the erase cycle (phase 1) or erasure phase 150 starts by setting the gate control voltage generator VG 126 and thus the control gate to the ground reference potential (0V) 152. The source voltage generator VS 122 and consequently the source region 18 will be set to a high positive voltage (approximately 10.0V) 154. The range of voltage applied to the source region 18 by the source voltage generator VS 122 have a range from 5.0 volts to 20.0V, preferably 10.0V.

Figure 6A:
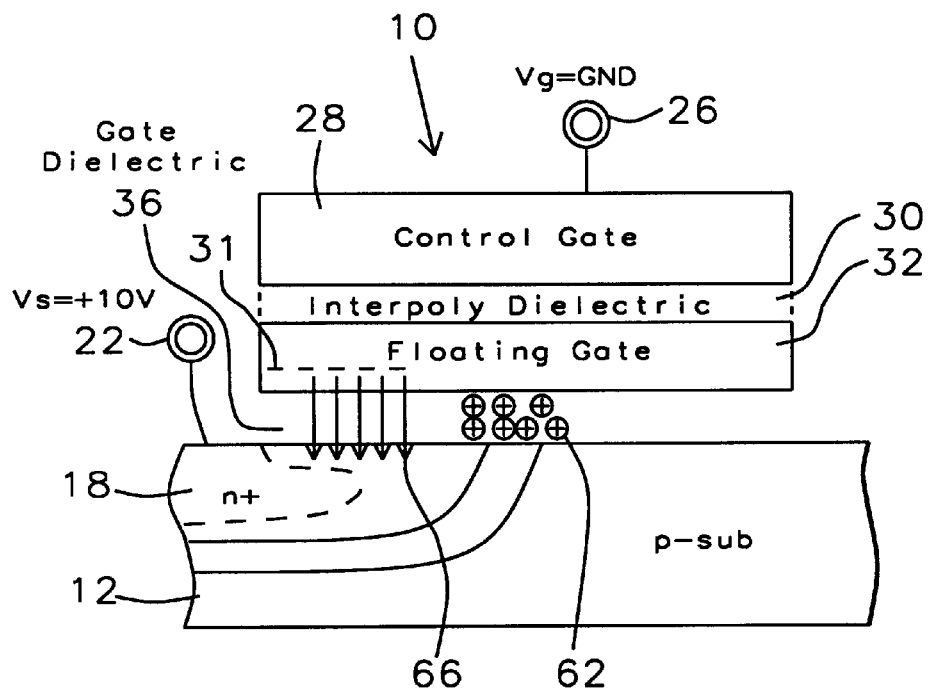
FIGS. 6a and 6b are cross-sectional views of a flash EEPROM illustrating the physical basis for the erasing and detrapping process of the erase cycle of this invention.
Figure 6B:
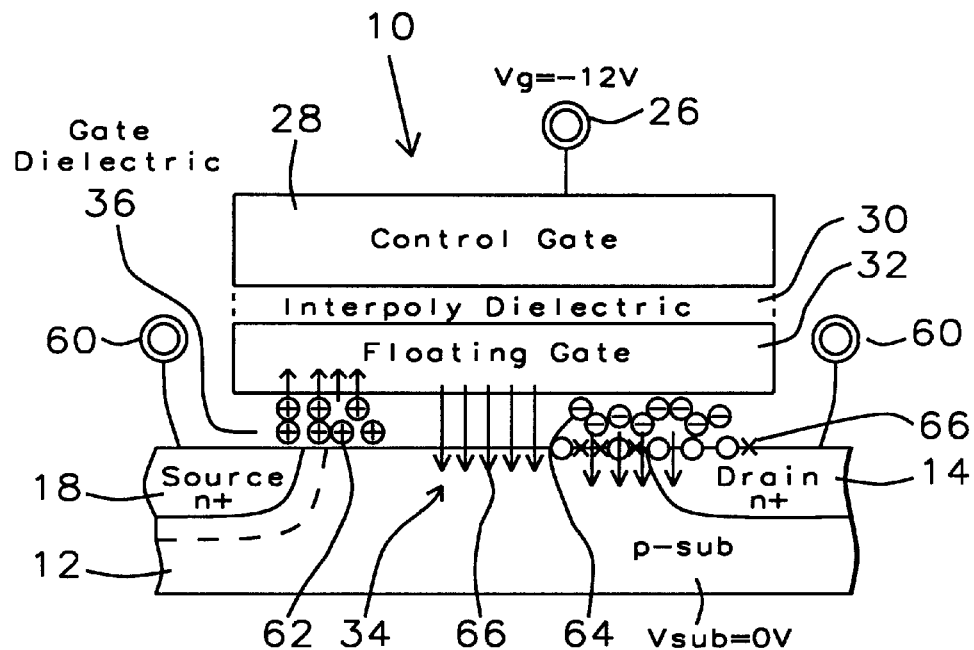

The substrate voltage generator Vsub 120 and thus the p-type substrate 12 will be set to the ground reference potential (0V) 156. The drain voltage generator VD 124 will be disconnected from the drain region 14 to be floating 158. The voltages as described and shown in FIG. 6a will force the trapped charges 31 on the floating gate 32 of the flash EEPROM cell 10 to migrate to the end of the floating gate 32 immediately above the source region 18. The electric field 66 in the tunneling oxide 36 will force these trapped electrons 31 to flow through the tunneling oxide 36 by the Fowler-Nordheim tunneling into the source region 18. At the completion of the phase 1 150 there will be positive charges 62 remaining in the tunneling oxide 36 as described above. Additionally there will be electrons 64 as shown in FIG. 6b, that have been trapped in the tunneling oxide 36 and at the surface states 66, again as described above.

Referring back to FIGS. 1, 4, and 5, a second phase (phase 2) 160 will terminate the erase cycle by bringing the source voltage generator VS 122 and the gate control voltage generator VG 126 to the ground reference potential (0V) 162 and 164. The substrate voltage generator Vsub 120 will remain at the ground reference potential (0V) 166. The drain voltage generator VD 124 will remain disconnected from the drain region 24 to keep the drain region 24 floating 168.

Having terminated the erasure phase 150 in phase 2 160, the detrapping phase (phase 3) can begin. The gate control voltage generator VG 126 is brought to a second relatively large negative voltage (−12V) 172. Concurrently, the source voltage generator VS 122 is disconnected from the source region 18 to allow the source region 18 to float 174. At this time, the substrate voltage generator Vsub 120 and thus the p-type substrate 12 will remain at the ground reference potential (0V) 176. While the drain voltage generator VD 124 will remain disconnected from the drain region 14 thus maintaining the drain region 14 at a floating condition 178.

The relative period of time for the phase 1 150, Phase 2 160 and Phase 3 170 of the erase cycle are each approximately at least 1 msec. in duration. The range of time for the phase 1 150, Phase 2 160 and Phase 3 170 of the erase cycle are respectively from approximately 1 msec. to approximately 15 msec for the phase 1 150 and Phase 3 170 of the erase cycle. Phase 2 160 will have a range of time of 0 msec. to approximately 1 msec. There are no absolute maximums for time for the duration of each of the phases.

The voltage range of the relatively large negative voltage (−12V) will be from approximately −5.0V to −20V.

Refer now to FIG. 6b for a description of the physical basis for the detrapping phase of the erase cycle of the flash EEPROM of this invention. As above described, during the detrapping phase (phase 3), the gate control voltage generator VG is set to a relatively large negative voltage (−12V). Since the gate control voltage generator VG is connected through the terminal 26 to the control gate 28, the control gate 28 will be set to the relatively large negative voltage (−12V). The source region 18 and the drain 14 will be disconnected from their respective voltage generators and allowed to be floating. The voltage of the substrate voltage generator Vsub will be set to the ground reference potential (0V) which will be connected through terminal 20 of FIG. 4 to the p-type substrate 12.

The voltage as described will set up an electric field 66 in the gate dielectric or tunneling oxide 36. Those electrons 64 trapped in the tunneling oxide 36 will be forced to be dissipated in the p-type substrate while the positive charges 62 will be attracted to the floating gate 32 thus eliminating any residual charges from the floating gate 32 or trapped charges from the tunneling oxide 36.

This process will insure that the erased threshold voltage for the flash EEPROM cell 10 will return to the low threshold voltage of a completely erased cell. The elimination of the trapped charges 64 will also allow the appropriate increase of the programmed threshold voltage to the high threshold voltage approximately (6V) of a programmed cell.

Figure 7A:
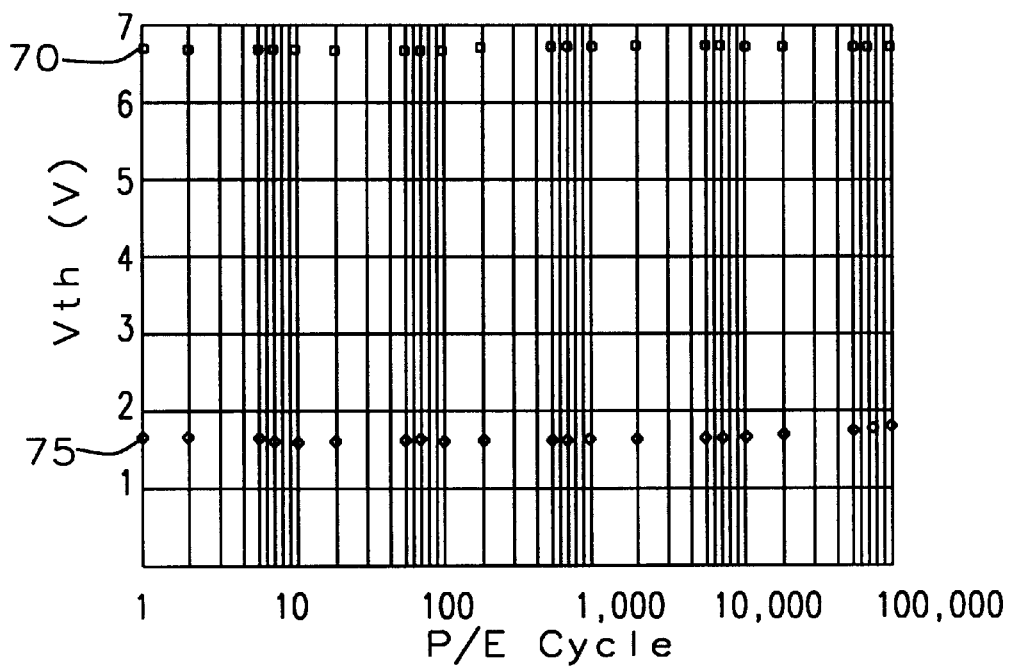
FIG. 7a is a plot of the threshold voltages versus the number of programming and erasing cycles using the erase cycle of this invention as shown in FIG. 5.

As is shown in FIG. 7a, the programmed threshold voltage 70 will remain at a relatively constant value of approximately 6.5V for at least 1,000,000 programming/erase cycles. Also, as can be seen, the erased threshold voltage 75 will remain at a constant value of approximately 1.5V for the 100,000 programming/erase cycles. By not degrading the threshold as seen in FIG. 3a, the flash EEPROM cell 10 of FIG. 4 and the flash EEPROM array 110 of FIG. 4 will maintain operation with out failure for programming/erase cycle in excess of 100,000 cycles.

Figure 7B:
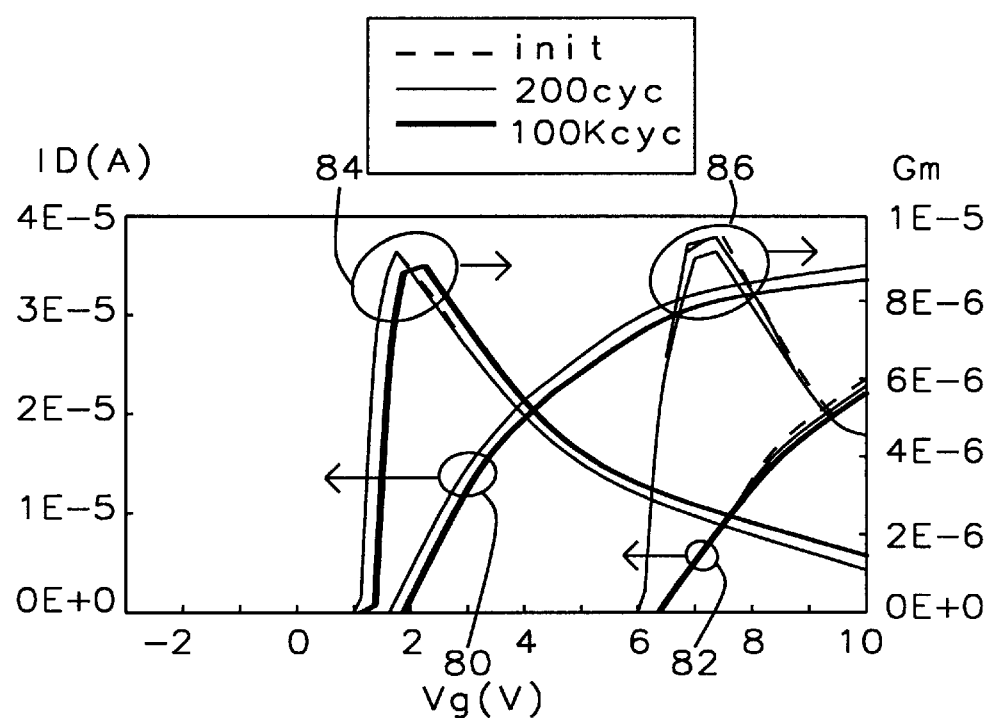
FIG. 7b is a plot of the drain current ID and the transconductance Gm versus the gate voltage VG of a flash EEPROM of this invention.

Another illustration of the elimination of the trapped charges using the erasure cycle of this invention can be seen in the FIG. 7b. The set of curves 80 and 82 show the response of the drain current $I_d$ versus the control gate voltage $V_g$. The set of curves 80 shows the drain current $I_d$ for an erased cell and the set of curves 82 are for a programmed cell. The plots illustrate that the drain current varies little over 100K program/erase cycles.

The set of curves 84 and 86 show the response of the transconductance $G_m$ versus the control gate voltage $V_g$. The set of curves 84 shows the transconductance $G_m$ for an erased cell and the set of curves 86 are for a programmed cell. The plots illustrate that the transconductance $G_m$ varies little over 100K program/erase cycles.

While this invention has been particularly shown and described with reference to the preferred embodiments thereof, it will be understood by those skilled in the art that various changes in form and details may be made without departing from the spirit and scope of the invention.

The invention claimed is:

1. A method to erase a flash EEPROM cell, which is comprised of a control gate, a floating gate, a source, a drain, and a tunneling oxide disposed upon a semiconductor substrate, to improve a write/erase threshold voltage closure from repeatedly writing and erasing said flash EEPROM cell, comprising the steps of:

erasing said flash EEPROM cell by the steps of,
   applying a large positive voltage pulse to the source of said EEPROM cell,
   concurrently applying a ground reference potential to said control gate and semiconductor substrate,
   concurrently floating said drain; and then
   detrapping said flash EEPROM cell by the steps of:
   floating said source and drain,
   concurrently applying the ground reference potential to said semiconductor substrate,
   concurrently applying a relatively large negative voltage pulse to said control gate.

2. The method to erase a flash EEPROM cell of claim 1 wherein erasing the flash EEPROM removes charges from the floating gate.

3. The method to erase a flash EEPROM cell of claim 1 wherein detrapping the flash EEPROM removes charges trapped in the tunneling oxide between the floating gate and the semiconductor substrate.

4. The method to erase a flash EEPROM cell of claim 3 wherein detrapping the flash EEPROM allows a separation of a programmed threshold voltage from an erased threshold voltage to be maintained over the repeated writing and erasing of said flash EEPROM, thus improving said write/erase threshold voltage closure.

5. The method to erase a flash EEPROM cell of claim 1 wherein the large positive voltage pulse has a voltage of from approximately +5.0V to approximately +20V, preferably +10.0V.

6. The method to erase a flash EEPROM cell of claim 1 wherein the relatively large negative voltage pulse has a voltage of from approximately −5.0V to approximately −20.0V, preferably −12.0V.

7. The method to erase a flash EEPROM cell of claim 1 wherein the large positive voltage pulse has a duration greater than approximately 10 msec. and the relatively large negative voltage pulse has a duration of greater than 10 msec.

8. A non-volatile semiconductor memory device comprising:

a semiconductor substrate of a first conductivity type;
   a pair of diffusions of a second conductivity type spaced distally from one another to form a source region and a drain region within said semiconductor substrate;
   a tunneling oxide insulation disposed upon said semiconductor substrate in a region generally between the source region and drain region in correspondence with a channel region and having a thickness which allows tunneling of carriers there through;
   a floating gate electrode disposed upon said tunneling oxide insulation generally in correspondence with said channel region;
   an inter-poly dielectric insulation disposed upon said floating gate electrode to insulate said floating gate;
   a control gate electrode disposed upon said inter-poly dielectric insulation generally aligned with said floating gate; and
   an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device,
   wherein charges are removed from the floating gate by the steps of:
   coupling a large positive voltage source to apply a large positive voltage pulse to the source of said EEPROM cell,
   simultaneously coupling a ground reference potential to the control gate and the semiconductor substrate, and
   simultaneously floating said drain,
   and wherein said trapped electrical charges are detrapped by the steps of:
   floating said source and drain,
   coupling the ground reference potential to said semiconductor substrate,
   simultaneously coupling a relatively large negative voltage source to apply a large negative voltage pulse to said control gate.

9. The non-volatile semiconductor memory device of claim 8 wherein the large positive voltage pulse has a voltage of from approximately +5.0V to approximately +20.0V, preferably +10.0V.

10. The non-volatile semiconductor memory device of claim 8 wherein the relatively large negative voltage pulse has a voltage of from approximately −5.0V to approximately −20.0V, preferably −12.0V.

11. The non-volatile semiconductor memory device of claim 8 wherein the large positive voltage pulse has a duration greater than approximately 10 msec. and the relatively large negative voltage pulse has a duration of greater than 10 msec.

12. A non-volatile semiconductor memory device comprising:

a semiconductor substrate of a first conductivity type;
   a plurality of memory cells arranged in an array wherein each cell comprises:
   a pair of diffusions of a second conductivity type spaced distally from one another to form a source region and a drain region within said semiconductor substrate,
   a tunneling oxide insulation disposed upon said semiconductor substrate in a region generally between the source region and drain region in correspondence with a channel region and having a thickness which allows tunneling of carriers there through,
   a floating gate electrode disposed upon said tunneling oxide insulation generally in correspondence with said channel region,
   an inter-poly dielectric insulation disposed upon said floating gate electrode to insulate said floating gate, and
   a control gate electrode disposed upon said inter-poly dielectric insulation generally aligned with said floating gate; and
   an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

coupling a moderately positive voltage source to apply a large positive voltage source pulse to the source of said EEPROM cell, simultaneously coupling a ground reference potential to the control gate and the semiconductor substrate, and simultaneously floating said drain, and wherein said trapped electrical charges are detrapped by the steps of:

floating said source and drain, coupling the ground reference potential to said semiconductor substrate, simultaneously coupling a relatively large negative voltage source to apply a large negative voltage pulse to said control gate.

13. The non-volatile semiconductor memory device of claim 12 wherein the moderately large positive voltage pulse has a voltage of from approximately +5.0V to approximately +20.0V, preferably +10.0V.

14. The non-volatile semiconductor memory device of claim 12 wherein the relatively large negative voltage pulse has a voltage of from approximately −5.0V to approximately −20.0V, preferably −12V.

15. The non-volatile semiconductor memory device of claim 12 wherein the large positive voltage has a duration greater than approximately 10 msec, and the second relatively large negative voltage pulse has a duration of greater than 10 msec.

16. An erasing means to remove charges and to detrap trapped electrical charges from flash EEPROM cells, wherein a flash EEPROM cell comprises a drain region, a source region, a floating gate, a control gate, a tunneling oxide, and an inter-poly dielectric disposed upon a semiconductor substrate, comprising:

a first voltage source coupled to the control gate;

a second voltage source coupled to the source region;

a third voltage source coupled to the drain region;

a fourth voltage source coupled to the semiconductor substrate; and an erasing control means coupled to the first, second, third, and fourth voltage sources to control said first, second, third, and fourth voltage sources wherein said erasing is accomplished by:

forcing said first voltage source to apply a ground reference voltage to the control gate of said EEPROM cell, forcing said second voltage source to apply a high positive voltage pulse to the source of said EEPROM cell, simultaneously forcing the fourth voltage sources to a ground reference voltage, and simultaneously forcing the third voltage source to a floating condition, and wherein said trapped electrical charges are detrapped by the steps of:

forcing said second and fourth voltage source to a floating condition, simultaneously forcing said fourth voltage source to apply the ground reference potential to said semiconductor substrate, and simultaneously forcing said first voltage source to apply a relatively large negative voltage pulse to said control gate.

17. The erasing means of claim 16 wherein detrapping the flash EEPROM allows a separation of a programmed threshold voltage from an erased threshold voltage to be maintained over the repeated writing and erasing of said flash EEPROM, thus improving said write/erase threshold voltage closure.

18. The erasing means of claim 16 wherein the large positive voltage pulse has a voltage of from approximately +5.0V to approximately +20.0V, preferably +10.0V.

19. The erasing means of claim 16 wherein the relatively large negative voltage pulse has a voltage of from approximately −5.0V to approximately −20.0V, preferably −12V.

20. The erasing means of claim 16 wherein the large positive voltage has a duration greater than approximately 10 msec, and the second relatively large negative voltage pulse has a duration of greater than 10 msec.

* * * * *